US006828245B2

(12) United States Patent
Chang

(10) Patent No.: US 6,828,245 B2
(45) Date of Patent: Dec. 7, 2004

(54) METHOD OF IMPROVING AN ETCHING PROFILE IN DUAL DAMASCENE ETCHING

(75) Inventor: Weng Chang, Taipei (TW)

(73) Assignee: Taiwan Semiconductor Manufacturing Co. Ltd, Hsin Chu (TW)

( * ) Notice: Subject to any disclaimer, the term of this patent is extended or adjusted under 35 U.S.C. 154(b) by 330 days.

(21) Appl. No.: 10/087,673

(22) Filed: Mar. 2, 2002

(65) Prior Publication Data

US 2003/0166345 A1 Sep. 4, 2003

(51) Int. Cl.[7] .............................................. H01L 21/302
(52) U.S. Cl. ...................... 438/709; 438/710; 438/717; 438/718; 438/724; 438/725
(58) Field of Search .............................. 438/709, 710, 438/717, 718, 724, 725

(56) References Cited

U.S. PATENT DOCUMENTS 6,329,290 B1 * 12/2001 Zhao ......................... 438/700
6,358,842 B1 * 3/2002 Zhou et al. ................. 438/633
6,406,995 B1 * 6/2002 Hussein et al. ............. 438/638

* cited by examiner

Primary Examiner—Nadine G. Norton
Assistant Examiner—Binh X. Tran
(74) Attorney, Agent, or Firm—Tung & Associates

(57) ABSTRACT

A plasma etching method for improving an etching profile including providing a substrate including an oxide containing insulating layer in a multilayer semiconductor device; providing a patterned photoresist layer exposing an uppermost layer of the substrate for anisotropically plasma etching a first opening; anisotropically plasma etching through a thickness of at least a portion of the substrate to form the first opening; blanket depositing an etching stop liner to cover at least a portion of the sidewalls of the first opening; patterning according to a photolithographic process for etching a second opening at least partially overlying and encompassing the first opening; and, anisotropically plasma etching through at least another portion of the thickness of the substrate including the first opening to form a second opening at least partially overlying a remaining portion of the first opening.

20 Claims, 3 Drawing Sheets

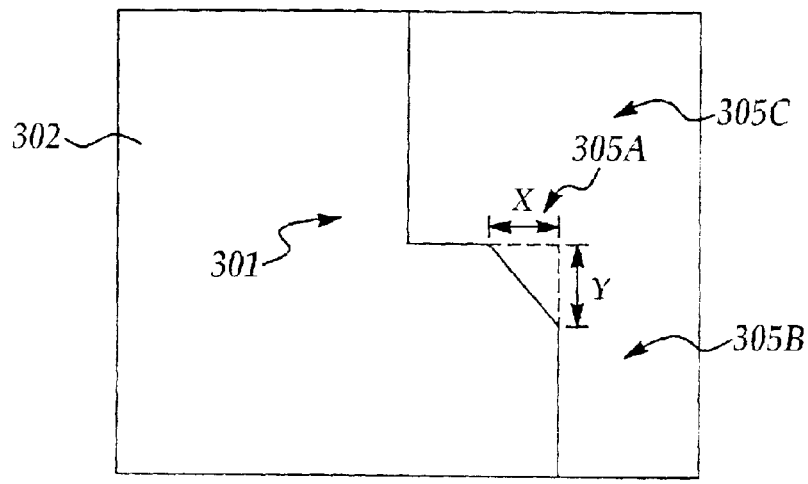
*Figure 3A*
SiON ETCH STOP LINER
| THICKNESS (A) | 0 | 100 | 200 | 300 |
|---|---|---|---|---|
| FACET X DIMENSION | 1000 | 800 | 570 | 710 |
| FACET Y DIMENSION | 1100 | 180 | 110 | 130 |
*Figure 3B*
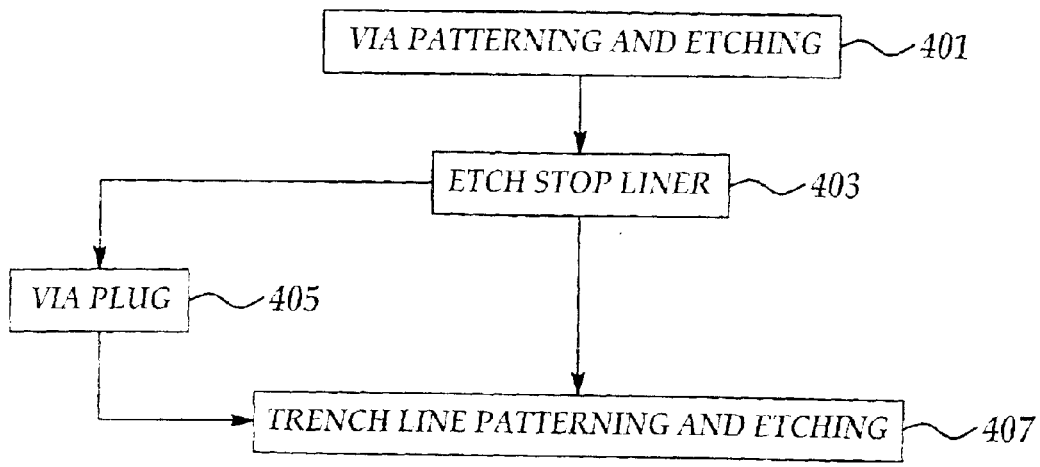
*Figure 4*

METHOD OF IMPROVING AN ETCHING PROFILE IN DUAL DAMASCENE ETCHING

FIELD OF THE INVENTION

This invention generally relates to plasma etching of semiconductor features and more particularly to a method for improving a trench etching profile at a trench/via interface in a dual damascene process.

BACKGROUND OF THE INVENTION

During the formation of semiconductor devices it is often required that the conductive layers be interconnected through holes in an insulating layer also referred to as an inter-metal or inter-level dielectric (IMD/ILD) layer. Such holes are commonly referred to as contact holes, i.e., when the hole extends through an insulating layer to an active device area, or vias, i.e., when the hole extends through an insulating layer between two conductive layers. The profile of a via or contact hole is of particular importance since that it exhibits specific electrical characteristics when the contact hole or via is filled with a conductive material. Typically, the holes are high aspect ratio holes, meaning that the ratio of length to width is at least greater than about 1 and may extend up to about 4 or higher. Such holes are typically formed by a plasma etch process where complex chemical processes result in relatively higher etching rates in one direction versus another, known as anisotropic etching. The relative anisotropicity or selectivity of the etching process will in turn determine the etching profile of an etched hole and consequently its aspect ratio. As semiconductor structures are inevitably driven to smaller sizes, successful etching of higher aspect ratio holes with uniform profiles is becoming more important and more difficult.

In anisotropically etching contact or via holes (openings), plasmas containing fluorocarbons or hydrofluorocarbons including oxygen and nitrogen are typically optimized in various steps in a plasma etching process to selectively etch through the various layers of materials included in a multi-layer semiconductor device. For example, it is typically required to selectively etch through an oxide containing layer, for example an IMD layer to a desired depth. Frequently, etching stop layers, for example, nitride or silicon carbide, are formed in the substrate for several reasons including providing a material non-selective to an etching chemistry to protect an underlying layer and to provide a dissimilar material for plasma etching endpoint detection to reliably etch to a particular depth. In addition, an etching stop layer functions as a hard mask resistant to an etching chemistry to reduce undesired isotropic etching in overlying layers.

For example, the damascene process is a well known semiconductor fabrication method for forming electrical interconnects between layers by forming vias and overlying connecting trench lines. In a typical dual damascene process, a via opening is first etched into an insulating layer also known as an inter-metal or inter-level dielectric (IMD/ILD) layer. The insulating layer is typically formed over a metal or conductive layer. After a series of photolithographic steps defining via openings and trench openings, the via openings and the trench openings are filled with a metal (e.g., Al, Cu) to form vias and trench lines, respectively. The excess metal above the trench level is then removed and the uppermost layer planarized usually by a chemical-mechanical polishing (CMP) process.

Referring to FIG. 1A, for example, is a typical dual damascene structure following via opening etching and trench etching. In a typical dual damascene processing approach it has been useful to form an etching stop layer between the trench layer and the via layer forming the trench/via interface. Following this approach, a substrate is provided, for example, having a conductive area 12A formed in an insulating layer 12B. Overlying the conductive area 12A and insulating layer 12B is formed a first etching stop layer 14A and a via insulating layer 16A for etching a via therein. Overlying the via insulating layer 16A is a second etching stop layer 14B. One approach in forming the dual damascene structure is to form a trench insulating layer 16B, followed by a third etching stop layer 14C which is photo-lithographically patterned and etched to form a via opening e.g., 20A that extends through the substrate to the conductive area 12A. Following formation of the via opening 20A, the photolithographic patterning process is repeated to etch a trench opening e.g., 20B formed substantially over the via opening e.g., 20A. The first, second, and third etching stop layers 14A, 14B, and 14C are typically formed of a nitride or carbide including for example, silicon nitride (e.g., $Si_3N_4$), silicon carbide (e.g., SiC), and silicon oxynitride (e.g., SiON). In a typical plasma etching process the etching stop layers e.g., 14A, 14B, and 14C are advantageously used to detect an etching depth, for example, by optical detection of etched plasma species and provide an increased etching selectivity, e.g., 14B and 14C, while etching the insulating layer to maintain a uniform etching profile. For example, when etching the trench opening e.g., 20B, the etching stop layer 14B protects the via opening 20A from isotropic etching when the trench etching depth reaches the etching stop layer 14B.

One shortcoming of the above approach is the presence of relatively high dielectric constant (e.g., >6.5) nitride or carbide etching stop layers which undesirably add to the overall capacitance of the multi-layer structure thereby increasing parasitic electrical contributions to signal delay times. Another drawback of forming etching stop layers between the insulating layers (IMD/ILD layers), which are frequently porous to reduce the dielectric constant of the insulating layer, is that poor adhesion between the etching stop and IMD layer results leading to reduced multi-layer strength and in many cases, peeling during subsequent chemical mechanical polishing processes. In an effort to overcome these shortcomings and drawbacks, another approach to dual damascene processing has been to eliminate etching stop layers including at the trench/via interface e.g., 14B, in the processing scheme. In this approach, referring to FIG. 1B. only one insulating layer is provided e.g., 16C for etching both the via opening 20A and trench opening 20B. In this approach, the trench etching process typically proceeds for a predetermined period of time in contrast with end-point detection provided by an etching stop layer, e.g., 14B in FIG. 1A. With the many etching variable involved in plasma processing, it has proven difficult to achieve consistent trench etching results by using a predetermined process window (etching time) for trench etching.

Another troublesome drawback to this approach is the unintended etching of the via opening 20A at the trench/via interface, for example, forming a faceted, tapered opening in the via profile e.g., 20C where the via opening profile increases in diameter at the trench/via interface. Non-uniform profiles such as the faceted profile 20C cause an undesirable departure from electrical property design specifications and thereby compromise the quality and reliability of the semiconductor device.

These and other shortcomings demonstrate a need in the semiconductor processing art to develop a method for improving a dual damascene plasma etching process to achieve more uniform etching profiles while enhancing plasma etching endpoint detection.

It is therefore an object of the invention to a method for improving a dual damascene plasma etching process to achieve more uniform etching profiles while enhancing plasma etching endpoint detection while overcoming other shortcomings and deficiencies in the prior art.

SUMMARY OF THE INVENTION

To achieve the foregoing and other objects, and in accordance with the purposes of the present invention, as embodied and broadly described herein, the present invention provides a plasma etching method for improving an etching profile.

In one embodiment, the method includes providing a substrate including an oxide containing insulating layer in a multilayer semiconductor device; providing a patterned photoresist layer exposing an uppermost layer of the substrate for anisotropically plasma etching a first opening; anisotropically plasma etching through a thickness of at least a portion of the substrate to form the first opening; blanket depositing an etching stop liner to cover at least a portion of the sidewalls of the first opening; patterning according to a photolithographic process for etching a second opening at least partially overlying and encompassing the first opening; and, anisotropically plasma etching through at least another portion of the thickness of the substrate including the first opening to form a second opening at least partially overlying a remaining portion of the first opening.

These and other embodiments, aspects and features of the invention will be better understood from a detailed description of the preferred embodiments of the invention which are further described below in conjunction with the accompanying Figures.

BRIEF DESCRIPTION OF THE DRAWINGS

FIG. 3A is a conceptual representation of a portion of a profile of a dual damascene structure according to the present invention.

FIG. 3B is a table of dimensional values according to an exemplary embodiment of the present invention.

FIG. 4 is a general process diagram encompassing several embodiments of the present invention.

DETAILED DESCRIPTION OF THE PREFERRED EMBODIMENTS

While the method of the present invention is explained in with reference to plasma etching of trench line openings in a dual damascene process it will be appreciated that the present invention may be applied to the etching of any semiconductor feature where the requirement of an etching stop layer may be avoided by including an etching stop liner according to the present invention to improve an etching stop profile and/or for providing an alternative endpoint detection means. For example, an etch stop liner may be provided in etched contact holes or vias in a stacked borderless process for creating vias and metal interconnects in a semiconductor manufacturing process.

In one embodiment of the present invention, an etching stop liner is blanket deposited to cover at least a portion of the sidewalls of an etched semiconductor opening, for example, a via opening prior to trench etching in a dual damascene process.

Figure 1A:
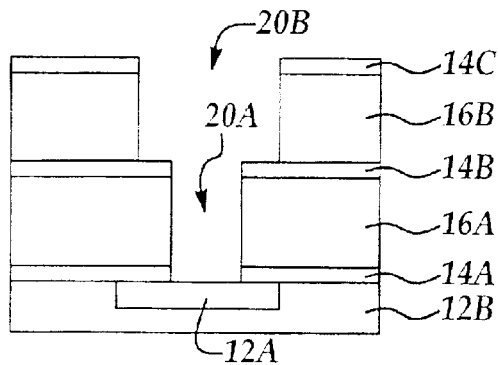
FIGS. 1A and 1B are representative cross section side views of a portion of a multilayer semiconductor device at stages of manufacturing according to the prior art.
Figure 1B:
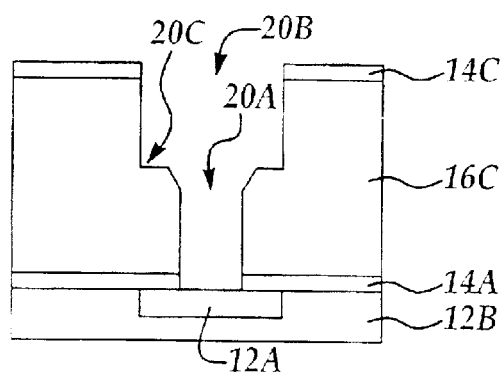
Figure 2A:
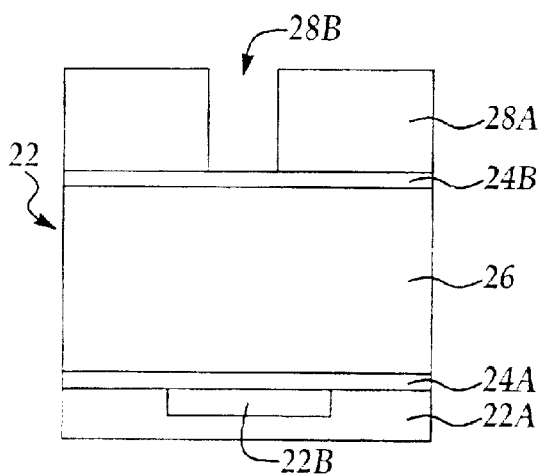
FIGS. 2A–2F are representative cross section side views of a portion of a multilayer semiconductor device at stages of manufacturing according to the present invention.

For example, referring to FIG. 2A, is shown a cross sectional side view of portion of a multilayer semiconductor device included in a semiconductor wafer showing a substrate 22 for creating for example, a via in a dual damascene structure at a stage in the manufacturing process. The substrate 22 includes a first insulating layer 22A with, for example, a conductive area 22B formed therein. Overlying the first insulating layer 22A and conductive area 22B, is typically formed a first etching stop layer 24A including a nitride or carbide material, for example, silicon nitride (e.g., $Si_3N_4$), silicon carbide (e.g., SiC), or silicon oxynitride (e.g., SiON). The etching stop layer 24A is typically deposited by a (chemical vapor deposition (CVD) process including for example, PECVD (plasma enhanced CVD), LPCVD (low pressure CVD), or HDPCVD (high density plasma CVD) under conditions that are well known in the art. A typical thickness of the etching stop layer 24A, for example, is between about 300 and 1000 Angstroms.

Overlying the first etching stop layer 24A is an inter-metal dielectric (IMD) layer 26 (insulating layer) for subsequently etching a semiconductor feature, for example, a via opening, the IMD layer being formed of, for example, silicon dioxide, or a low-k doped silicon dioxide. Typically, the dielectric constant of the low-k material is less than about 3.0 to minimize electrical parasitic capacitive effects. It will be appreciated that other low-k materials may be used and that the method according to the present invention is likewise applicable to those materials, particularly if they are porous materials. Additional exemplary low-k inorganic materials include, for example, doped and undoped porous oxides, xerogels, or SOG (spin-on glass). Exemplary low-k organic materials include, for example, polysilsesquioxane, parylene, polyimide, benzocyclobutene, amorphous Teflon, and spin-on polymer (SOP).

Overlying the IMD layer 26 is a second etching stop layer 24B, formed of, for example, a nitride or carbide including silicon nitride, silicon carbide, or silicon oxynitride. The etching stop layer 24B functions as a hard mask for controlling the etching profile of a subsequently etched via opening. Optionally formed over the second etching stop layer 24B, is a dielectric anti-reflective coating (DARC) layer (riot shown) to reduce light reflectance in a subsequent photolithographic patterning step of subsequently deposited photoresist layer 28A. The Optional DARC layer is typically a silicon oxynitride layer which can be optically optimized by varying oxygen content.

Still Referring to FIG. 2A, the photoresist 28A layer with a thickness of about 3000 to about 10000 Angstroms is photolithographically patterned by conventional means to define an etching hole 28B, for example a via pattern overlying and exposing the etching stop layer 24B (or DARC layer) for etching a via opening. The photoresist layer 28A may include a conventional photoresist layer exposed at conventional UV wavelengths (e.g. 250–400 nm) or may be a single or bi-layer resist used for example, in deep ultraviolet (DUV) patterning using wavelengths of less than about 250 nm.

Figure 2B:
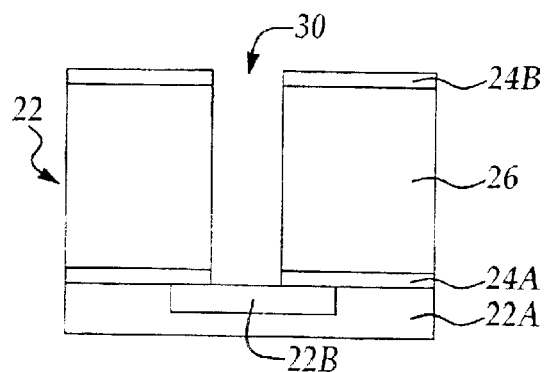

Following patterning of the photoresist layer to expose a portion e.g., 28B of the uppermost layer, for example, the etching stop layer 24B, a plasma etching process also known as a reactive ion etching (RIE) process is carried out using a conventional plasma etching chemistry. For example, an etching chemistry including fluorocarbons and/or hydrofluorocarbons, oxygen, and nitrogen is first optimized to etch through the second etching stop layer 24B. The etching chemistry is then optimized for etching through the IMD layer 26 to the first etching stop layer 24A. Plasma etching is then carried out to etch through the first etching stop layer 24A to form an opening 30, for example a via opening, in closed communication with conductive area 22B as shown in FIG. 2B after stripping the photoresist layer 28A.

Figure 2C:
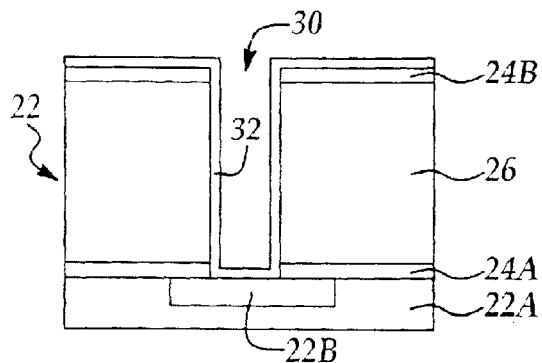

According to one embodiment of the present invention, after formation of the via opening 30 and stripping of the photoresist layer 28A, for example, by an oxygen containing plasma, referring to FIG. 2C, a etching stop liner 32 is blanket deposited to preferably conformally cover the bottom and sidewalls of the via opening. It will be appreciated, however, that the method of the present invention is operable by covering a portion of the sidewalls to at least include the upper half of the via opening 30.

According to the present invention, the etching stop liner 32 is Preferably formed of a nitride or carbide including for example, silicon nitride (e.g., $Si_3N_4$), titanium nitride (e.g., TiN), silicon carbide (e.g., SiC), or silicon oxynitride (e.g., SiON). The etching stop liner is Preferably deposited by a chemical vapor deposition (CVD) process or a spin on process by methods known in the art. For example, in a CVD process the deposition process may include, for example, PECVD (plasma enhanced CVD), LPCVD (low pressure CVD), or HDPCVD (high density plasma CVD) by reacting a precursor with a nitrogen containing or carbon containing precursor by methods that are known in the art. The etching stop liner 32 is preferably deposited to a thickness of about 50 Angstroms to about 500 Angstroms.

Figure 2D:
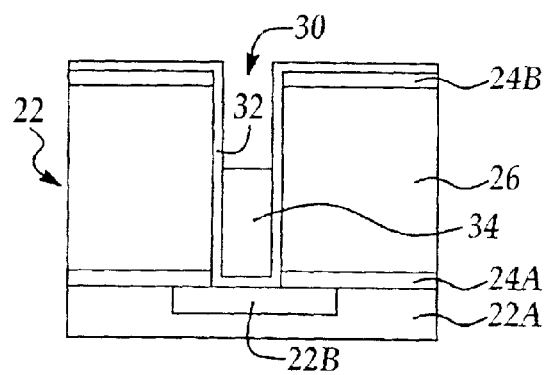

In another embodiment of the present invention, following deposition of the etching stop liner 32, the via opening 30 is optionally partially filled with a via plug 34 as shown in FIG. 2D according to a blanket deposited spin-on process. The via plug is preferably a flowable resinous material and may be a photosensitive polymer, for example, a photoresist. The via plug may be cured by known methods including thermal curing and in the case of a photosensitive polymer, a polymerizing radiation curing process including, for example, exposure to ultraviolet light (e.g., 250–400 nm). Exemplary polymers include, for example, include methyl methacrylate, polyolefins, polyacetals, polycarbonates, polypropylenes and polyimides. Alternatively, the via plug 34 may be formed of an oxide, for example, the same material as the IMD layer 26 and deposited by a spin-on or CVD process.

The via plug 34 is preferably formed to at least fill the via opening 30 to a level about equal to the depth of a subsequently etched trench line opening overlying the via opening 30. The level of the via plug 34 is preferably controlled by an etchback process including an oxygen containing plasma to remove deposited via plug material from the semiconductor surface and to adjust the level of the via plug 34 to partially fill the via opening 30 to the desired level. The via plug 34, for example, is advantageous in providing protection for the via sidewalls and a dissimilar etching material for endpoint detection in a subsequent trench line opening etching process.

Figure 2E:
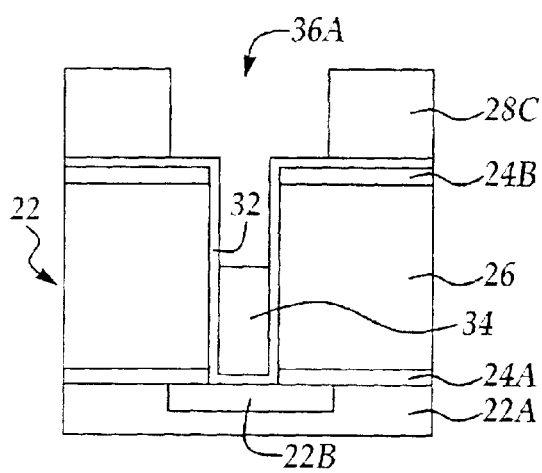
Figure 2F:
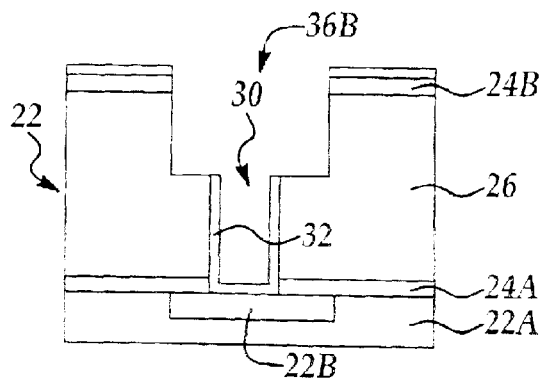

Following deposition of the etching stop liner 32 and optionally partially filling via opening 30 with via plug 34, a photoresist layer 28C as shown in FIG. 2E is deposited over the semiconductor process surface for photolithographically patterning the uppermost surface, for example, to expose the etch stop layer 24B with opening 36A for etching a trench line opening. For example, as shown in FIG. 2F, a plasma anisotropic etching process (RIE) is carried out to etch through the etching stop layer 24B to include partially etching through the IMD layer 26 to partially include the via opening 30, to a depth about equal to the level of the previously formed via plug 34 thereby forming trench line opening 36B. The trench line opening 36B is completed by a conventional RIE ashing and cleaning process in an oxygen rich plasma to remove remaining via plug 34 from the remaining portion of the via opening 30 and the trench line photoresist layer 28C to complete the formation of the dual damascene opening as shown in FIG. 2F.

Referring to FIG. 3A is shown a portion (one side) of a cross section of a conceptual etching profile of a dual damascene opening 301 formed in an insulating layer 302. Applying the method of the present invention in providing an etching stop liner (not shown for clearer picture of tapered opening 305A), the faceted or tapered opening 305A at the surface in the upper portion of the via opening 305B was found to be reduced in size following trench etching. For example, in the tapered opening area 305A, the dimension X represents a width in Angstroms of the opening and the dimension Y represents a depth in Angstroms of the tapered opening area 305A at the interface of the via portion 305B and trench line portion 305C of the dual damascene opening 301. Referring to FIG. 3B are shown tabulated values of the change in the dimensions X and Y of tapered opening portion 305A in FIG. 3A according to an increase in the thickness of a silicon oxynitride etching stop liner (not shown for clarity). In one exemplary implementation of one embodiment of the present invention, both the X an Y dimensions of the tapered opening are advantageously reduced. According to FIG. 3B, an optimal thickness of a silicon oxynitride etching stop liner is between about 100 Angstroms and about 300 Angstroms. It will be appreciated that the optimal thickness will depend on the material, but generally a thickness of between about 50 Angstroms and about 500 Angstroms will be suitable.

Referring to FIG. 4 is shown a general process flow diagram encompassing several embodiments of the present invention. Beginning with process 401, a via patterning and etching process is carried out on a substrate, in one embodiment an IMD layer without an etching stop liner interposed between a trench line portion and a via portion (i.e., via formed in a continuous portion of the insulating (IMD) layer). Following process 401, an etching stop liner is formed according to process 403 by blanket depositing an etching resistant material, preferably a nitride or carbide, to at least partially cover the via opening sidewalls. Following process 403 in a preferred but optional embodiment, a via plug is formed according to process 405 to at least partially fill the via opening, preferably to a level at least about equal to a subsequently etched trench line depth. Following either process 405 or 403, a trench line patterning and etching process according to process 407 is performed to complete the formation of the dual damascene etching process.

The various advantages included in the present invention overcome shortcomings in the prior art including providing an etching method whereby a more uniform etching profile is achieved in etching a semiconductor feature, for example, a dual damascene structure by providing an etching stop liner to at least partially cover via sidewalls prior to trench etching. The advantages of the present invention include improved electrical performance including reduced resistive and capacitive parasitic effects. In addition, in one embodiment a plasma etching endpoint detection is enhanced by providing a via plug to improve the reliability and predictability of a trench etching process window where an etching stop layer at a trench/via interface is absent.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A dual damascene formation method for reducing a faceted etching profile at a trench/via interface comprising the steps of:
providing a substrate comprising a dielectric insulating layer;
providing a first patterned photoresist layer exposing an uppermost layer of the substrate for plasma etching a first opening;
plasma etching through a first thickness portion of the dielectric insulating layer to form the first opening;
removing the first patterned photoresist layer;
blanket depositing an etching stop liner to line the sidewalls of the first opening;
at least partially filling the first opening with a plug of resinous material;
photolithographically patterning a second photoresist layer for etching a second opening at least partially overlying and encompassing the first opening; and,
plasma etching through a second thickness portion of the dielectric insulating layer to form the second opening.

2. The method of claim 1, wherein the step of blanket depositing comprises depositing the etching stop liner to conformally cover the sidewall and bottom portions of the first opening.

3. The method of claim 1, wherein the etching stop liner is selected from the group consisting of a nitride and a carbide.

4. The method of claim 1, wherein the plug is at least partially filled to a level in the first opening about equal to a depth of the subsequently formed second opening.

5. The method of claim 1, wherein the dielectric insulating layer is selected from the group consisting of silicon oxide, doped silicon dioxide, porous oxides, xerogels, SOG (spin-on glass, polysilsesquioxane, parylene, polyimide, benzocyclobutene, amorphous polytetrafluoroethylene, and spin-on polymer (SOP).

6. The method of claim 1, wherein the first opening comprises a via opening and the second opening comprises a trench line opening to form a dual damascene structure.

7. The method of claim 6, wherein the dual damascene structure comprises a trench portion and via portion having a via/trench interface comprising the dielectric insulating layer.

8. The method of claim 1, wherein the etching stop liner is selected from the group consisting of silicon nitride, silicon carbide, silicon oxynitride, and titanium nitride.

9. The method of claim 8, wherein the etching stop liner is formed having a thickness of about 50 Angstroms to about 500 Angstroms.

10. The method of claim 1, wherein the plug is selected from the group consisting of a resinous polymer and a photosensitive resinous polymer.

11. The method of claim 10, wherein the photosensitive resinous polymer is at least partially cured by exposure to polymerizing radiation.

12. A dual damascene formation method in a single dielectric insulating layer for reducing facet formation at a via/trench interface comprising the steps of:
providing a substrate comprising a dielectric insulating layer;
providing a first patterned photoresist layer exposing an uppermost layer of the substrate for plasma etching a via opening;
plasma etching through a first thickness portion of the dielectric insulating layer to form the via opening in closed communication with an underlying conductive area;
removing the first patterned photoresist layer;
blanket depositing an etching stop liner to cover the sidewalls and bottom portion of the via opening;
at least partially filling the via opening with a via plug;
photolithographically patterning a second photoresist layer for etching a trench line opening at least partially overlying and encompassing the via opening; and,
plasma etching through a second thickness portion of the dielectric insulating layer to form the trench line opening to form a dual damascene structure.

13. The method of claim 12, wherein the step of blanket depositing comprises depositing the etching stop liner conformally.

14. The method of claim 12, wherein the etching stop liner is selected from the group consisting of a nitride and a carbide.

15. The method of claim 12, wherein the dielectric insulating layer is selected from the group consisting of silicon oxide, doped silicon dioxide, porous oxides, xerogels, SOG (spin-on glass, polysilsesquioxane, parylene, polyimide, benzocyclobutene, amorphous polytetrafluoroethylene, and spin-on polymer (SOP).

16. The method of claim 12, wherein the via plug comprises a material selected from the group consisting of methyl methacrylates, polyolefins, polyacetals, polycarbonates, polypropylenes, polyimides, and oxides.

17. The method of claim 12, wherein the etching stop liner is selected from the group consisting of silicon nitride, silicon carbide, silicon oxynitride, and titanium nitride.

18. The method of claim 17, wherein the etching stop liner is formed having a thickness of about 50 Angstroms to about 500 Angstroms.

19. The method of claim 12, wherein the via plug is filled to a level in the via opening about equal to a depth of the subsequently formed trench line opening.

20. The method of claim 19, wherein the via plug is selected from the group consisting of a resinous polymer and a photosensitive resinous polymer.

* * * * *